(12) United States Patent
Lin et al.

(10) Patent No.: US 12,362,177 B2
(45) Date of Patent: Jul. 15, 2025

(54) METHOD OF MANUFACTURING SEMICONDUCTOR DEVICES

(71) Applicant: TAIWAN SEMICONDUCTOR MANUFACTURING COMPANY, LTD., Hsinchu (TW)

(72) Inventors: Po-Han Lin, Hsinchu (TW); Huan-Chieh Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 461 days.

(21) Appl. No.: 17/829,154

(22) Filed: May 31, 2022

(65) Prior Publication Data

US 2023/0386835 A1 Nov. 30, 2023

(51) Int. Cl.
*H01L 21/027* (2006.01)
*H01L 21/311* (2006.01)
*H01L 21/768* (2006.01)
*H01L 23/528* (2006.01)

(52) U.S. Cl.
CPC .... *H01L 21/0274* (2013.01); *H01L 21/31116* (2013.01); *H01L 21/31144* (2013.01); *H01L 21/76816* (2013.01); *H01L 21/76877* (2013.01); *H01L 23/528* (2013.01)

(58) Field of Classification Search
CPC .......... H01L 21/0274; H01L 21/31116; H01L 21/31144; H01L 21/76816; H01L 21/76877; H01L 23/528; H01L 21/31105; H01L 23/5226
See application file for complete search history.

(56) References Cited

U.S. PATENT DOCUMENTS

| | | | |
|---|---|---|---|
| 2005/0170607 A1 | 8/2005 | Hirohama et al. | |
| 2018/0090370 A1 | 3/2018 | Hung et al. | |
| 2019/0067000 A1 | 2/2019 | Shen et al. | |
| 2020/0006121 A1 | 1/2020 | Liu et al. | |

FOREIGN PATENT DOCUMENTS

| | | |
|---|---|---|
| CN | 110648903 A | 1/2020 |
| JP | 2005-244167 A | 9/2005 |
| TW | 201913226 A | 4/2019 |

*Primary Examiner* — Robert G Bachner
(74) *Attorney, Agent, or Firm* — STUDEBAKER BRACKETT PLLC

(57) ABSTRACT

In a method of manufacturing a semiconductor device, a target layer to be patterned is formed over a substrate, a mask layer having an opening is formed over the target layer, the opening is enlarged in a first direction without enlarging the opening in a second direction crossing the first direction by a directional process, where the first and second directions are parallel to an upper surface of the substrate, and the target layer is patterned to form a hole corresponding to the opening.

20 Claims, 9 Drawing Sheets

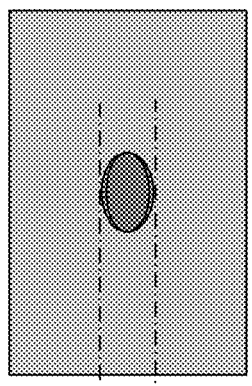
FIG. 1A
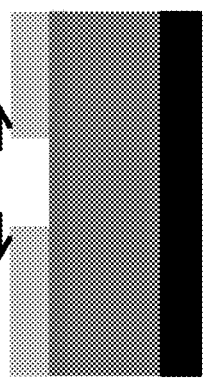
FIG. 2A
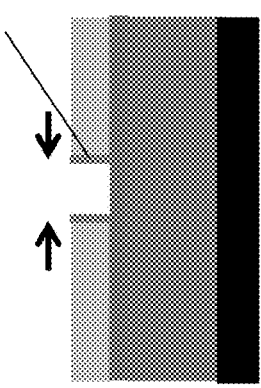
FIG. 3A
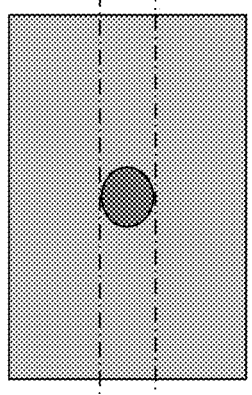
FIG. 1B
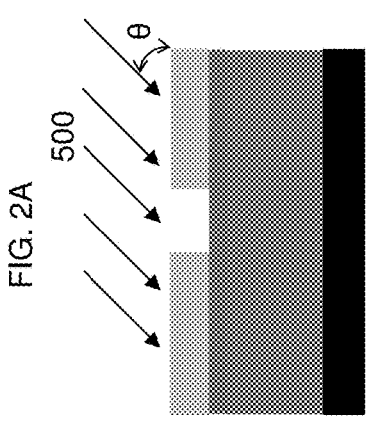
FIG. 2B
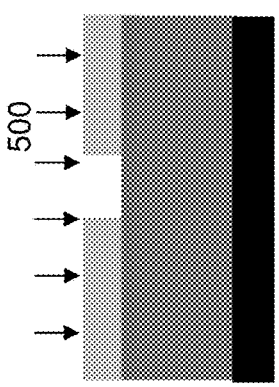
FIG. 3B
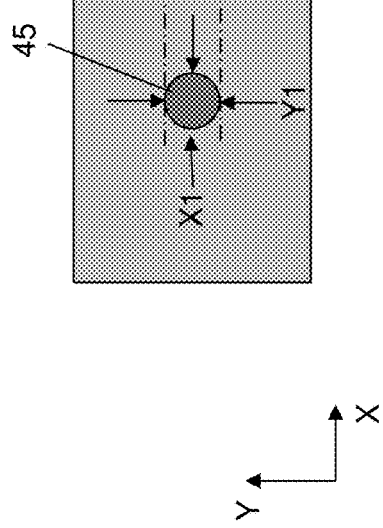
FIG. 1C
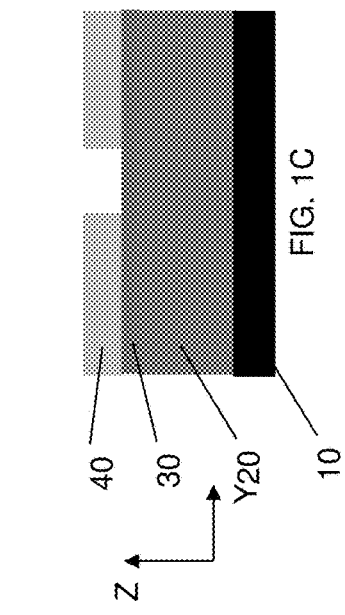
FIG. 2C
FIG. 3C

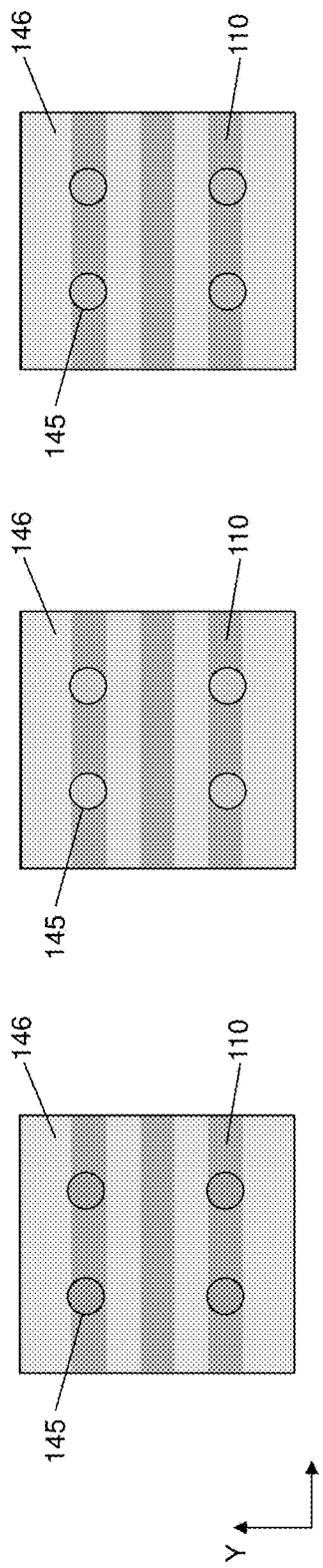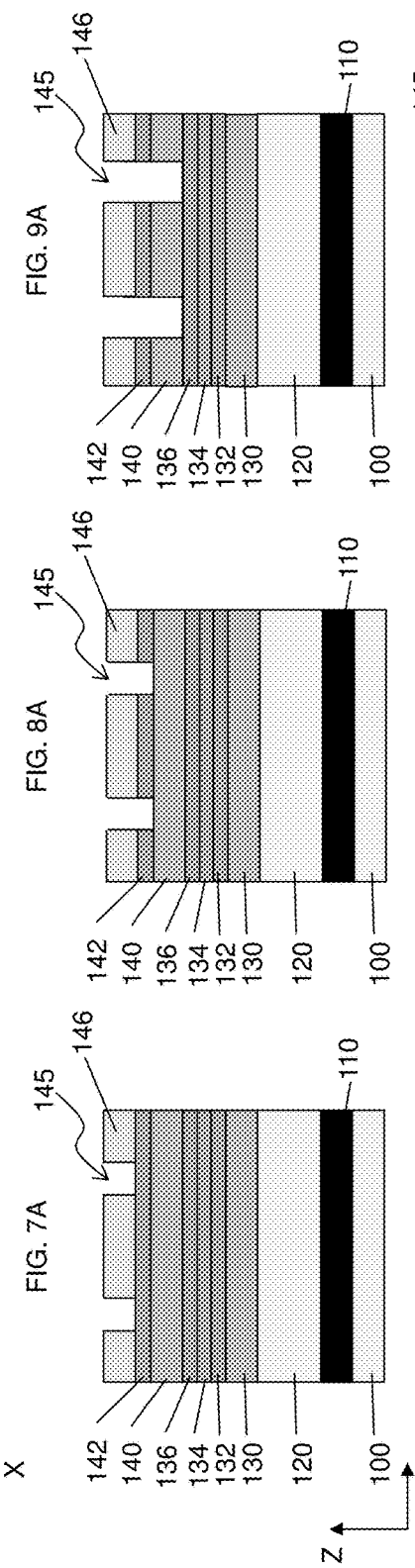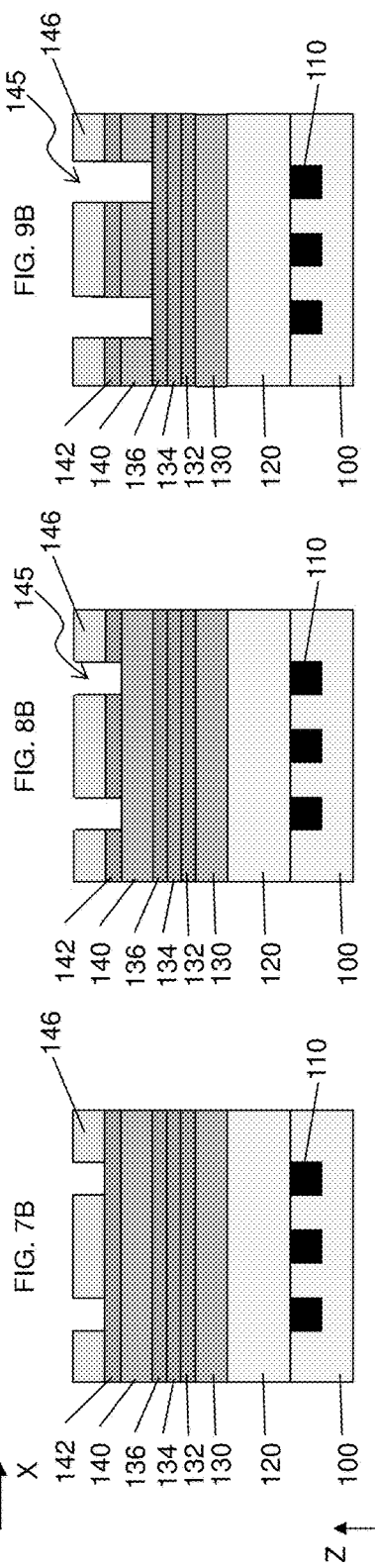

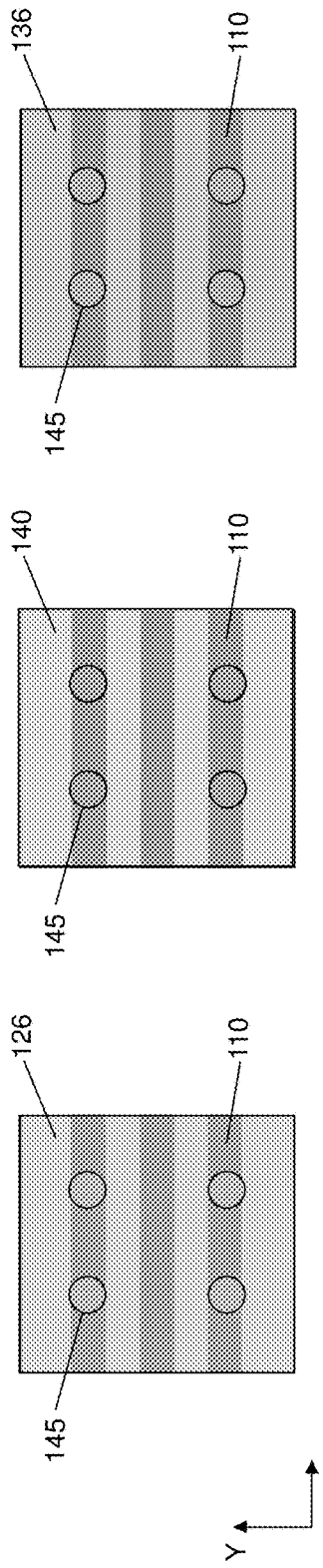

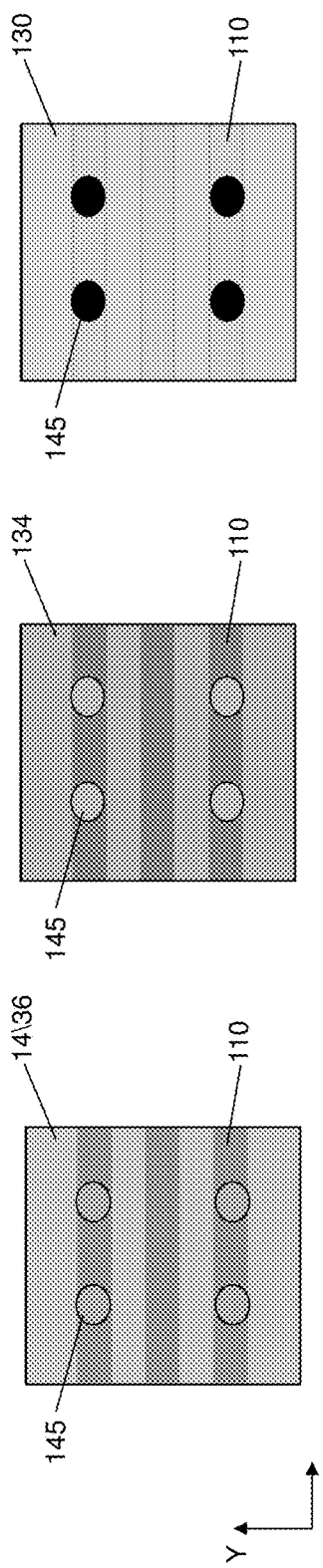
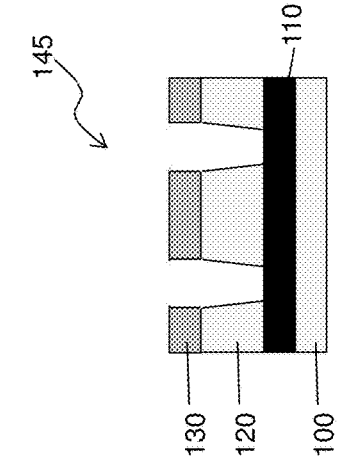
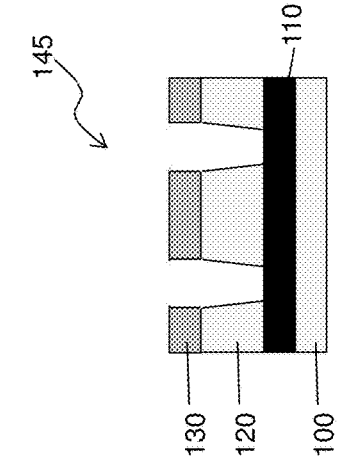
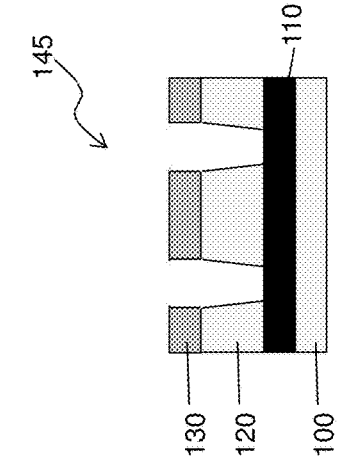
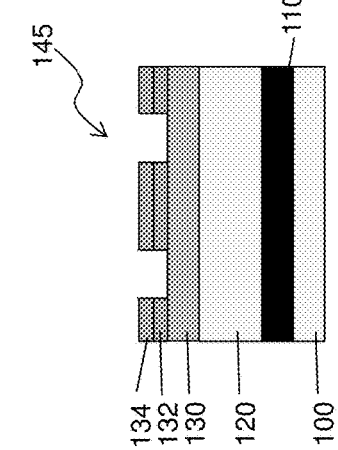
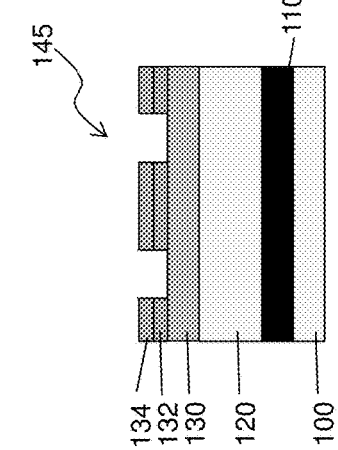
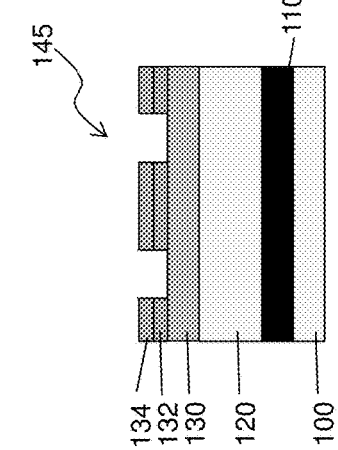
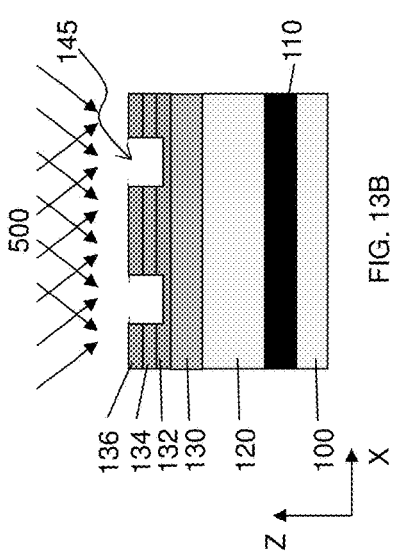
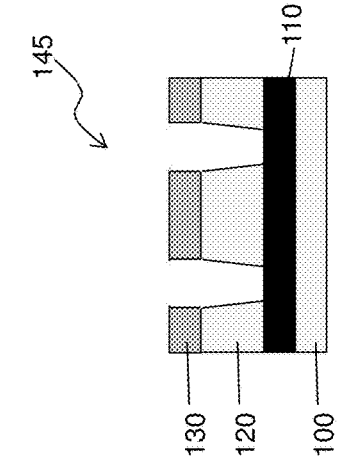

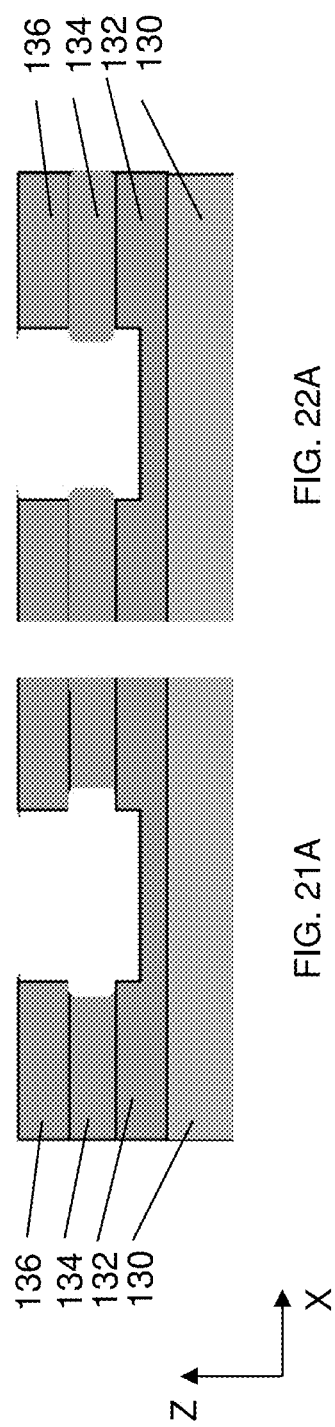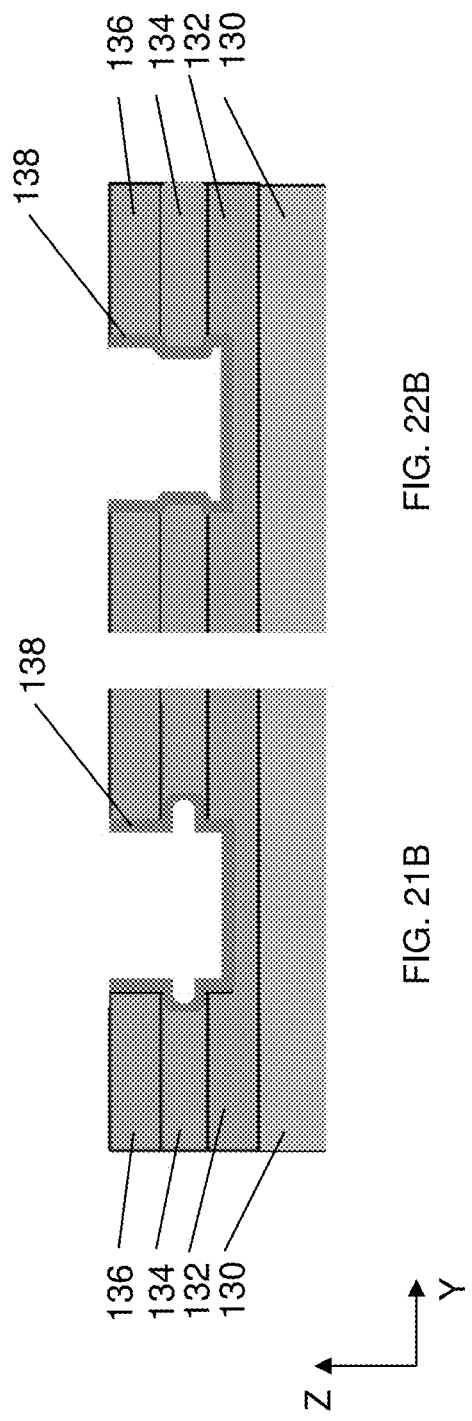

METHOD OF MANUFACTURING SEMICONDUCTOR DEVICES

BACKGROUND

At semiconductor technology nodes of 7 nm or smaller, line-and-space (L/S) patterning requires pitch resolution in optical lithography smaller than about 32 nm. In general, even if extreme ultraviolet (EUV) lithography is employed, the resolution limitation by EUV single-exposure technology (SPT) is about 28 nm to about 34 nm. To obtain smaller L/S pitch patterns, a double-patterning technology (DPT) with twice repeating lithography exposure processes will be needed. However, the cost of EUV with the DPT approach would be too expensive for a mass-production application. In addition, overlay error tolerance becomes smaller as the pitch or CD (critical dimension) of the pattern become smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, 1C, 2A, 2B, 2C, 3A, 3B, 3C, 4A, 4B, 4C, 5A, 5B, 5C, 6A, 6B and 6C show various views of a sequential manufacturing operation of a semiconductor device according to an embodiment of the present disclosure.

FIGS. 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B and 18C show various views of a sequential manufacturing operation of a semiconductor device according to an embodiment of the present disclosure.

FIGS. 21A, 21B, 22A and 22B show various views of a sequential manufacturing operation of a semiconductor device according to an embodiment of the present disclosure.

DETAILED DESCRIPTION

Figure 4A:
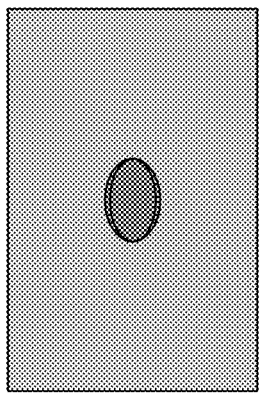

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure. In the present disclosure, a directional process to modify the dimension of an opening will be explained.

A directional process includes a directional etching technique and a directional deposition technique. The directional etching can be characterized as horizontal or surface anisotropic or selective etching, in which a target layer or pattern is etched substantially in only one direction (e.g., X direction) within a plane (X-Y plane) parallel to a substrate, substantially without etching another direction (e.g., Y direction). A directional etching can be performed by tuning various etching parameters to generate etching species (free radicals) that travel in a substantially horizontal direction or that are incident on the substrate with a large incident angle of more than about 10-30 degrees (where the angle of 90 degrees is horizontal).

In some embodiments of the present disclosure, the directional process includes both an etching aspect and a deposition aspect. The directional process includes adjustable parameters to be tuned including, but not limited to, gas composition, substrate temperature, process time, process pressure, radio frequency (RF) bias voltage and/or RF bias power for plasma, gas flow rate, wafer tilting, or other suitable parameters, or combinations thereof.

FIGS. 1A, 1B, 1C, 2A, 2B, 2C, 3A, 3B, 3C, 4A, 4B, 4C, 5A, 5B, 5C, 6A, 6B and 6C show various views of a sequential manufacturing operation of a semiconductor device according to an embodiment of the present disclosure. It is understood that additional operations can be provided before, during, and after processes shown by FIGS. 1A-6C, and some of the operations described below can be replaced or eliminated, for additional embodiments of the method. The order of the operations/processes may be interchangeable. FIGS. 1A, 2A, 3A, 4A, 5A and 6A are top views (plan views), FIGS. 1B, 2B, 3B, 4B, 5B and 6B are cross sectional views along the X direction and FIGS. 1C, 2C, 3C, 4C, 5C and 6C are cross sectional views along the Y direction.

In some embodiments, as shown in FIGS. 1A-1C, a target layer 20 to be patterned is formed over a substrate 10. In some embodiments, the substrate 10 is of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate may include an epitaxial layer (epi-layer), which may be strained for performance enhancement, and/or may include a silicon-on-insulator (SOI) structure. In one embodiment, a p-type silicon substrate is used. In some embodiments, one or more electronic devices, such as a transistor, are formed over the substrate.

The target layer 20 to be patterned is one or more layers of dielectric material, metallic conductive material, or semiconductor material. In some embodiments, the target layer 20 is a dielectric layer disposed over the one or more electronic devices. In some embodiments, the target layer 20 includes one or more of silicon oxide, SiON, silicon nitride, SiOC, SiOCN, SiCN or organic material. In some embodiments, one or more additional layers or features are disposed between the substrate and the target layer 20.

In some embodiments, a first hard mask layer 30 is formed over the target layer 20. In some embodiments, the first hard mask layer 30 includes a different material than the target layer 20. In some embodiments, the first hard mask layer 30 includes one or more of silicon oxide, SiON, silicon nitride, SiOC, SiOCN, SiCN, aluminum oxide, hafnium oxide, polysilicon, amorphous silicon, TiN or any other suitable material. In some embodiments, the thickness of the first hard mask layer 30 is in a range from about 5 nm to 20 nm and is in a range from about 8 nm to 12 nm in other embodiments, depending on design and/or process requirements.

In some embodiments, a second hard mask layer 40 is formed over the first hard mask layer. In some embodiments, the second hard mask layer 40 includes an oxide-based material, such as silicon oxide, SiON, SiOC, SiOCN, aluminum oxide, hafnium oxide, zirconium oxide, titanium oxide, tantalum oxide or other suitable material. In some embodiments, the thickness of the second hard mask layer 40 is in a range from about 5 nm to 20 nm and is in a range from about 8 nm to 12 nm in other embodiments, depending on design and/or process requirements.

The target layer 20, the first mask layer 30 and the second mask layer 40 are formed by suitable film formation processes, such as chemical vapor deposition (CVD), atomic layer deposition (ALD), physical vapor deposition (PVD) including sputtering, and electro plating.

Then, a first opening 45 is formed in the second hard mask layer 40 by using one or more lithography and etching operations as shown in FIGS. 1A-1C. In some embodiments, the first opening 45 is a hole pattern having a diameter X1 or Y1, as shown in FIG. 1A.

Next, as shown in FIGS. 2A-2C and 3A-3C, one or more directional processes 500 are performed to enlarge the dimension of the first opening along the X direction. In some embodiments, the directional process 500 includes applying ions or ion beams from ±X directions with an angle θ with respect to the surface of the second hard mask layer 40 as shown in FIG. 2B. FIG. 2B shows ion beams 500 from the +X direction. In some embodiments, the ion beams include ions of Ar, Ne, Si or N. In certain embodiments, Ar ions are used. In some embodiments, an ion implantation apparatus or an ion milling apparatus are used provide the ion beams 500. In some embodiments, the substrate is inclined with respect to the incoming ion beams 500 to have the angle θ as shown in FIG. 2B and the substrate is scanned in the X/Y directions within the horizontal plane (perpendicular to the ion beam). In some embodiments, the angle θ is more than zero degrees and equal to or less than about 80 degrees, and is in a range from about 20 degrees to about 45 degrees in other embodiments. The angle is about 30 degrees in some embodiments. In some embodiments, a dose amount is in a range from about $1\times10^{14}$ ions/cm$^2$ to about $5\times10^{16}$ ions/cm$^2$, and an acceleration voltage is in a range from about 0.7 keV to about 10 keV.

In other embodiments, the directional process 500 is performed by using a directional plasma etching apparatus. In the directional plasma etching apparatus, radicals or ions are provided from one direction or from two opposing directions, with the angle θ.

As shown in FIG. 2B, the first opening 45 is expanded in the X axis (±X directions) by etching of the directional process 500. In contrast, substantially no etching occurs in the Y axis. In some embodiments, when the second hard mask layer 40 is made of oxide (e.g., silicon oxide), etched products or byproducts generated or sputtered by the ion beams or radicals from the oxide are re-deposited over the second hard mask layer 40. Where the beams or radicals are strong or sufficient in amount, the re-deposited oxide is removed again by etching, and there is substantially no deposition on such regions (less than 0.5 nm). In contrast, where the beams or radicals are weak or small in amount, the re-deposited oxide remains as a redeposited layer. As shown in FIGS. 3A-3C, in some embodiments, the sidewalls of the first opening 45 along the X axis are substantially free from the redeposited layer, and the redeposited layer 50 is formed on the sidewalls of the first opening 45 along the Y axis. In some embodiments, the redeposited layer 50 is formed at the bottom of the first opening 45. The redeposited layer 50 includes elements of the second hard mask layer, for example, silicon and oxygen in some embodiments.

Accordingly, as shown in FIGS. 3A-3C, the width of the first opening 45 in the X axis is enlarged or expanded, while the width of the first opening 45 in the Y axis is not enlarged or is shrunk by the directional process. In some embodiments, the enlarged amount in the X axis (both directions) is about 10% to about 30% of the original dimension X1 (i.e., the width after the directional process is 1.1 to 1.3 times the original width X1), and is about 15% to about 25% of the original dimension X1 in other embodiments. The shrinkage amount in the Y axis is zero or equal to or less than about 15% (i.e., the width after the directional process is 1 to 0.85 times the original width Y1) in some embodiments, and is about 5% to about 10% in other embodiments.

Figure 5A:
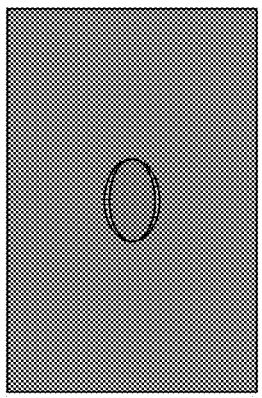
Figure 6A:
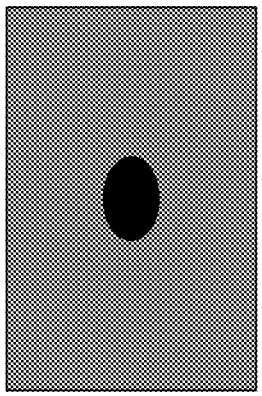
Figure 4B:
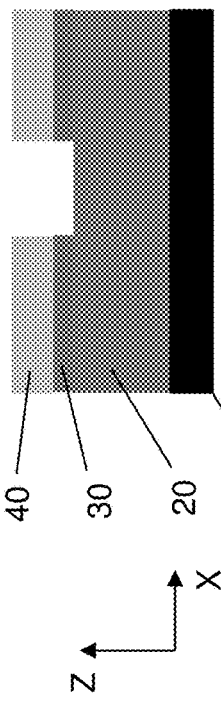
Figure 5B:
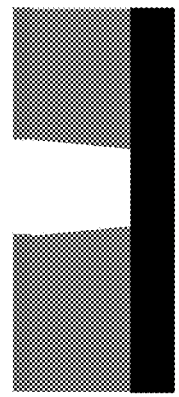
Figure 6B:
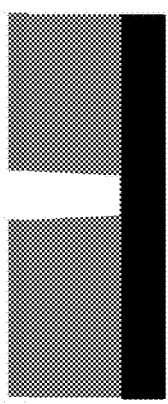
Figure 4C:
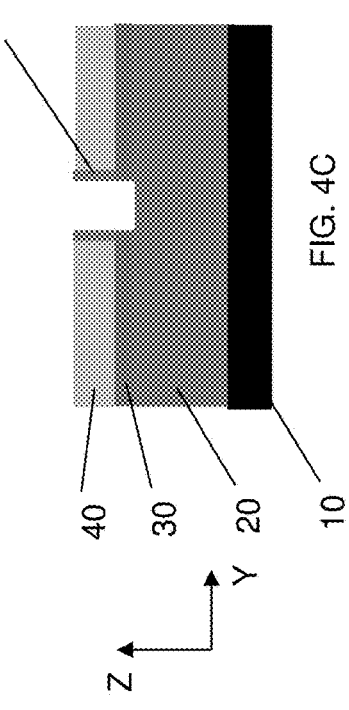
Figure 5C:
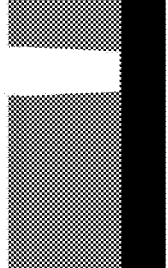
Figure 6C:
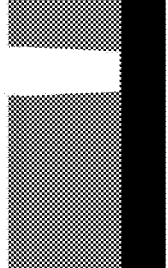

Next as shown in FIGS. 4A-4C, the first mask layer 30 is patterned by using the second hard mask layer 40 as an etching mask. Then, as shown in FIGS. 5A-5C, the second mask layer 40 is removed. In some embodiments, after the directional operation 500, a wet and/or dry cleaning operation is performed to remove the redeposited layer 50. Further, as shown in FIGS. 6A-6C, the target layer 20 is patterned by using the first hard mask layer 30 as an etching mask. In some embodiments, after the first hard mask layer 30 is patterned, the target layer 20 is patterned without removing the second mask layer 40 by a separate process. In some embodiments, when the target layer 20 and the second hard mask layer 40 are made of the same material, e.g., silicon oxide, the second hard mask layer 40 is removed during the etching of the target layer 20. Further, when the target layer 20 and the second hard mask layer 40 are made of different material from each other, no first mask layer is used, and the second hard mask layer is directly formed on the target layer 20 in some embodiments.

FIGS. 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B and 18C show various views of a sequential manufacturing operation of a semiconductor device according to an embodiment of the present disclosure. It is understood that additional operations can be provided before, during, and after processes shown by FIGS. 7A-18C, and some of the operations described below can be replaced or eliminated, for additional embodiments of the method. The order of the operations/processes may be interchangeable. The "A" figures, (FIGS. 7A, 8A, . . . ) are top views (plan views), the "B" figures (FIGS. 7B, 8B, . . . ) are cross sectional views along the X direction and the "C" figures (FIGS. 7C, 8C, . . . ) are cross sectional views along the Y direction. Materials, configurations, dimensions, structures, conditions and operations the same as or similar to those explained with respect to FIGS. 1A-6C may be employed in the following embodiments, and some of the explanations may be omitted.

As shown in FIGS. 7A-7C, a first ILD layer 100 is disposed over a substrate on which one or more transistors are formed. One or more first wiring patterns 110 are formed are embedded in the first ILD layer 105. In some embodiments, the first wiring patterns 110 are made of Cu, Al, W, Co, Ru, Ir or alloy thereof. A second ILD layer 120 is formed over the first ILD layer. In some embodiments, the second ILD layer 120 is a target layer to be patterned. Then, as shown in FIGS. 7A-7C, a first hard mask system including a first bottom layer 130, a first intermediate layer 132, a first middle layer 134 and a first oxide layer 136 are formed in this order over the second ILD layer 120. Further, a second hard mask system including a second bottom layer 140, a second middle layer 142 and a photo resist pattern 146 are formed in this order over the first hard mask system.

In some embodiments, the first bottom layer 130 and the second bottom layer 140 are made of an organic material. The organic material may include a plurality of monomers or polymers that are not cross-linked. In some embodiments, the bottom layers contain a material that is patternable and/or have a composition tuned to provide anti-reflection properties. Exemplary materials for the bottom layers include carbon backbone polymers, such as polyhydroxystyrene (PHS), poly methyl methacrylate (PMMA), polyether, and combinations thereof, and other organic polymers containing aromatic rings. The bottom layers are used to planarize the structure, as the underlying structure may be uneven. In some embodiments, the bottom layers are formed by a spin coating process. In other embodiments, the bottom layers are formed by another suitable deposition process. The thickness of the bottom layers is in a range from about 50 nm to about 200 nm, respectively in some embodiments and is in a range from about 80 nm to about 120 nm in other embodiments. In some embodiments, after the bottom layers are formed, an annealing operation is performed.

In some embodiments, the first intermediate layer 132 includes one or more of silicon oxide, silicon oxynitride, silicon nitride, SiOC, SiOCN, SiCN or any other suitable material. In some embodiments, silicon oxide formed by low-temperature plasma CVD at a temperature in a range from about 100° C. to about 250° C. is used. In some embodiments, the thickness of the first intermediate layer 132 is in a range from about 10 nm to about 30 nm.

In some embodiments, the first middle 134 includes a silicon based dielectric material different from the first intermediate layer 123, and includes one or more of silicon oxide, silicon oxynitride, silicon nitride, SiC, SiOC, SiOCN, SiCN or any other suitable material. In some embodiments, SiC formed by CVD or ALD is used. In some embodiments, the thickness of the first middle layer is in a range from about 10 nm to about 30 nm.

In some embodiments, the first oxide layer 136, similar to the second hard mask layer 40 as set forth above, includes an oxide-based material, such as silicon oxide, SiON, SiOC, SiOCN, aluminum oxide, hafnium oxide, zirconium oxide, titanium oxide, tantalum oxide or other suitable material. In some embodiments, silicon oxide is used. In some embodiments, the thickness of the first oxide layer 136 is in a range from about 5 nm to about 20 nm and is in a range from about 8 nm to about 12 nm in other embodiments, depending on design and/or process requirements.

In some embodiments, the second middle layer 142 includes one or more of silicon oxide, silicon oxynitride, silicon nitride, SiC, SiOC, SiOCN, SiCN or any other suitable material. In some embodiments, SiC formed by CVD or ALD is used. In some embodiments, the thickness of the second middle layer 142 is in a range from about 10 nm to about 30 nm.

In some embodiments, the first and/or second middle layers include a silicon containing layer including silicon and an organic material. In some embodiments, the middle layer contains silicon particles in an amount of about 50 wt % to about 80 wt %.

One or more openings 145 are formed in the photo resist pattern 146. In some embodiments, the opening 145 is a substantially circular hole. As shown in FIG. 7A, the openings 145 are formed over and aligned with the first wiring patterns 110 in the Y direction. In some embodiments, the size (diameter) of the opening 145 is the same as the width of the first wiring pattern 110 in the Y direction. In other embodiments, the size of the opening 145 is 1-10% greater than the width of the first wiring pattern 110. In certain embodiments, the size of the opening 145 is 1-10% smaller than the width of the first wiring pattern 110.

Then, as shown in FIGS. 8A-8C, the second middle layer 142 is etched by using the photo resist pattern 146 as an etching mask to extend the opening 145 into the second middle layer 142. In some embodiments, the etching substantially stops at the surface of the second bottom layer 140.

Further, as shown in FIGS. 9A-9C, the second bottom layer 140 is etched by using the photo resist pattern 146 and/or the second middle layer 142 as an etching mask to extend the opening 145 into the second bottom layer 140. In some embodiments, the etching substantially stops at the surface of the first oxide layer 136. In some embodiments, after the photo resist pattern 146 is removed, the second bottom layer 140, is patterned using the second middle layer 142 as an etching mask.

Further, as shown in FIGS. 10A-10C, the first oxide layer 136 is etched by using the second bottom layer 140 and/or the second middle layer 142 as an etching mask to extend the opening 145 into the first oxide layer 136. In some embodiments, the etching substantially stops at the surface of the first middle layer 134. In some embodiments, the second middle layer 142 is removed before or during the etching of the first oxide layer 136.

Next, as shown in FIGS. 11A-11C, the first middle layer 134 is etched by using the second bottom layer 140 as an etching mask to extend the opening 145 into the first middle layer 134. In some embodiments, the etching substantially stops at the surface of the first intermediate layer 132.

In some embodiments, as shown in FIGS. 12A-12C, the first middle layer 134 is etched by using the second bottom layer 140 and/or the first oxide layer 136 as an etching mask to extend the opening 145 into the first middle layer 134. In some embodiments, a part of the first intermediate layer 132 is etched as shown in FIGS. 12B and 12C. In some embodiments, about 10% to about 70% of the thickness of the first intermediate layer 132 is etched. In some embodiments, the second bottom layer 140 is removed before or during the etching of the first middle layer 134.

Next, as shown in FIGS. 13A-13C and 14A-14C, one or more directional processes 500 as explained above are performed to enlarge the dimension of the opening 145 formed in the first oxide layer 136 and the first middle layer 134 (and partially in the first intermediate layer 132) along the X direction.

As shown in FIG. 13B, the opening 145 is expanded in the X axis (±X directions) by a directional process 500 of etching. In contrast, substantially no etching occurs in the Y axis. In some embodiments, etched products or byproducts 138 generated or sputtered by the ion beams or radicals from the first oxide layer 136 are re-deposited over the inner sidewall of the opening 145 as shown in FIG. 13C. In some embodiments, the sidewalls of the opening 145 along the X axis are substantially free from the redeposited layer, and the redeposited layer 138 is formed on the sidewalls of the opening 145 along the Y axis. In some embodiments, the redeposited layer 138 is formed at the bottom of the opening 145. The redeposited layer 138 includes silicon and oxygen in some embodiments and further includes carbon in some embodiments.

In some embodiments, as shown in FIGS. 14A-14C, the remaining part of the first intermediate layer 132 is etched during the directional operation 500 and the upper surface of the first bottom layer 130 is exposed. In some embodiments, after the directional operation 500, a wet and/or dry cleaning operation is performed to remove the redeposited layer 138.

Accordingly, as shown in FIGS. 14A-14C, the width of the opening 145 in the X axis is enlarged or expanded, while the width of the opening 145 in the Y axis is not enlarged or is shrunk by the directional process. In some embodiments, the enlarged amount in the X axis (both directions) is about 10% to about 30% of the original dimension (i.e., the width after the directional process is 1.1 to 1.3 times the original width), and is about 15% to about 25% of the original dimension in other embodiments. The shrinkage amount in the Y axis is zero or equal to or less than about 15% (i.e., the width after the directional process is 1 to 0.85 times the original width) in some embodiments, and is about 5% to about 10% in other embodiments. In some embodiments, as shown in FIG. 14A, the opening 145 does not extend beyond the first wiring pattern 110 in plan view. Thus, even if there is a slight overlay error (e.g., about 0.5 nm to about 2 nm) along the Y direction between the opening 145 in the photo resist layer 146 and the first wiring pattern 110, the directional process 500 can compensate such an overlay error.

Figure 16A:
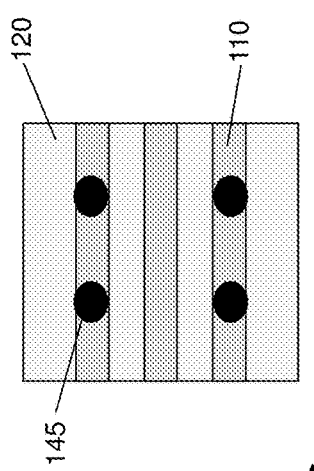
Figure 16B:
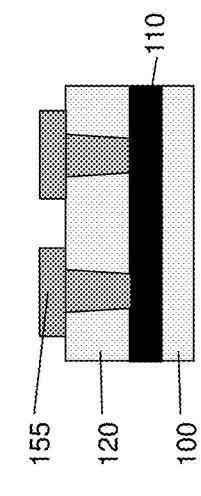
Figure 16C:
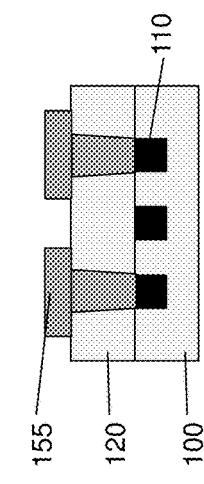

Further, as shown in FIGS. 15A-15C, the first bottom layer 130 and the second ILD layer 120 are etched to expose the upper surfaces of the first wiring patterns 110. In some embodiments, the first bottom layer 130 is etched by using the first middle layer 134 and/or the first intermediate layer 132 as an etching mask to extend the opening 145 into the first bottom layer 130, and then the second ILD layer 120 is etched. In some embodiments, the first middle layer 134 and/or the first intermediate layer 132 are removed before or during the etching of the first bottom layer 130 and/or the etching of the second ILD layer 120. In some embodiments, the opening 145 formed in the second ILD layer 120 is tapered having a smaller bottom than a top. Then, as shown in FIGS. 16A-16C, the first bottom layer 130 is removed by using a suitable operation including a wet and/or dry etching operation.

Figure 17A:
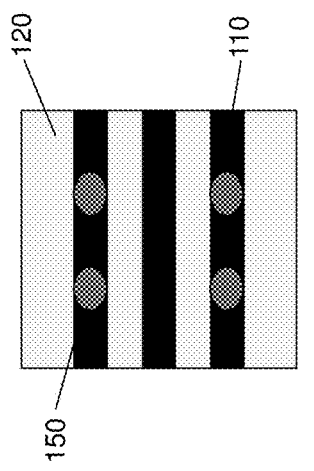
Figure 18A:
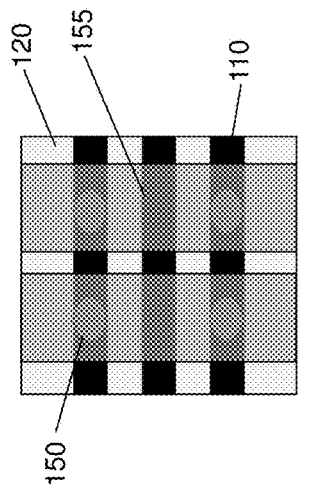
Figure 17B:
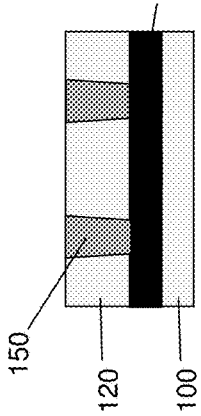
Figure 18B:
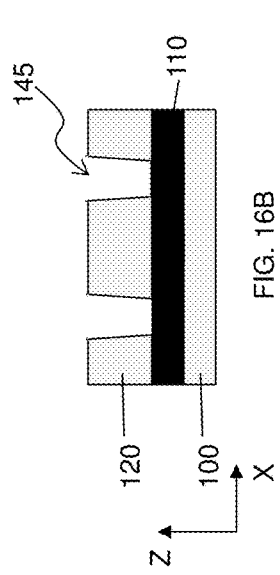
Figure 17C:
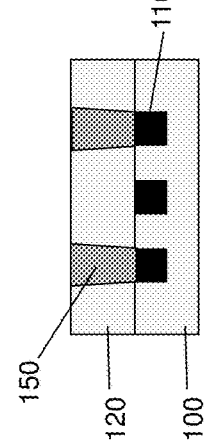
Figure 18C:
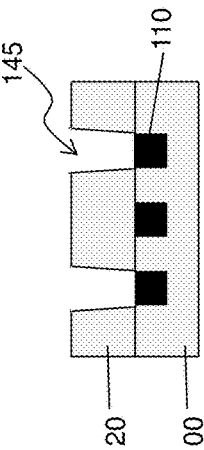

Further, as shown in FIGS. 17A-17C, one or more conductive layers are formed in the opening 145 of the second ILD layer 120 to form via contacts 150, and then as shown in FIGS. 18A-18C, one or more second wiring patterns 155 extending in the Y direction are formed. In some embodiments, the via contact 150 and/or the second wiring pattern 155 include one or more layers of layers of Cu, W, Ni, Co, Mo, Ti, or alloys thereof. In some embodiments, the via contact 150 and the second wiring patterns 155 are formed as a continuous layer by a damascene process.

Figure 19B:
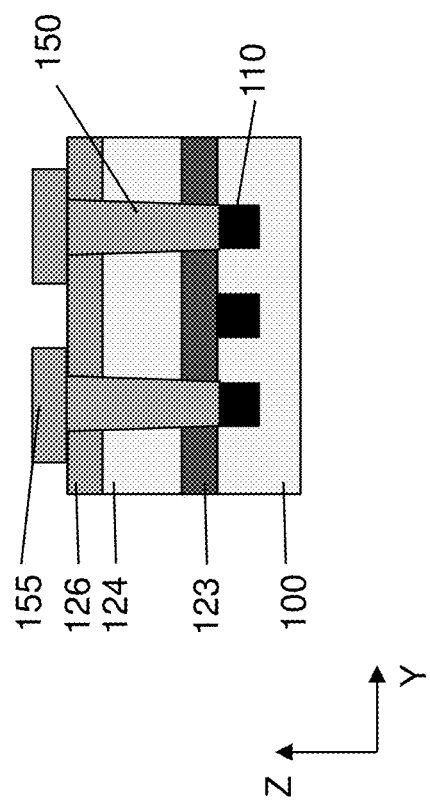
FIGS. 19A and 19B show various views of a sequential manufacturing operation of a semiconductor device according to an embodiment of the present disclosure.
Figure 19A:
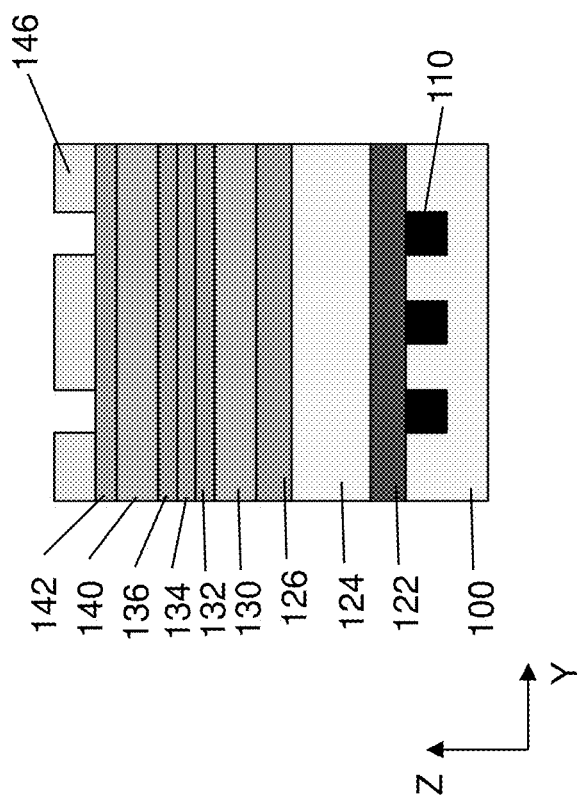

In some embodiments, instead of the second ILD layer 120, the target layer includes an etch stop layer 122 disposed over the first ILD layer 100, a low-k dielectric layer 124 and a cap layer 126 as shown in FIGS. 19A and 19B. In some embodiments, the etch stop layer 122 includes silicon nitride or SiON. In some embodiments, the low-k dielectric layer 124 includes SiOC, SiCN, SiOCN, an organic material, a porous material or any other dielectric material having a dielectric constant smaller than about 3.5. In some embodiments, the cap layer 126 includes silicon oxide formed from tetraethyl orthosilicate (TEOS). In some embodiments, the via contact 150 passes through the cap layer 126, the low-k dielectric layer 124 and the etch stop layer 122 to reach the first wiring pattern 110 as shown in FIG. 19B. In some embodiments, the cap layer 126 is removed and then via contact 150 is formed passing through the low-k dielectric layer 124 and the etch stop layer 122 to reach the first wiring pattern 110.

Figure 20B:
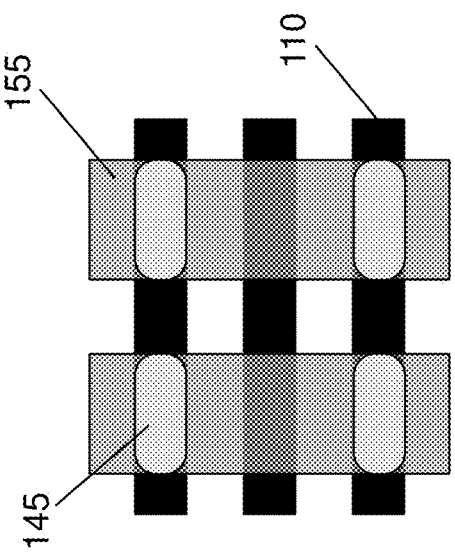
FIGS. 20A, 20B and 20C show various views of a sequential manufacturing operation of a semiconductor device according to an embodiment of the present disclosure.
Figure 20C:
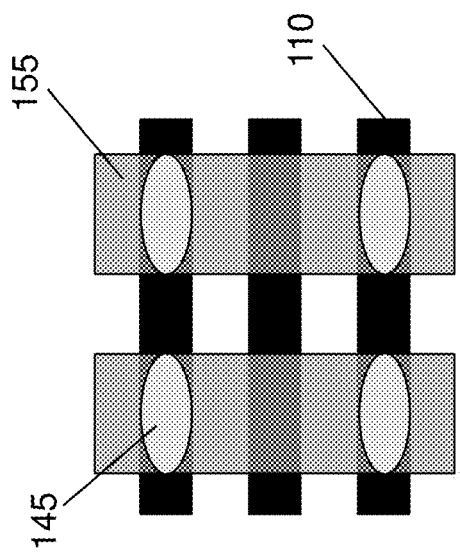
Figure 20A:
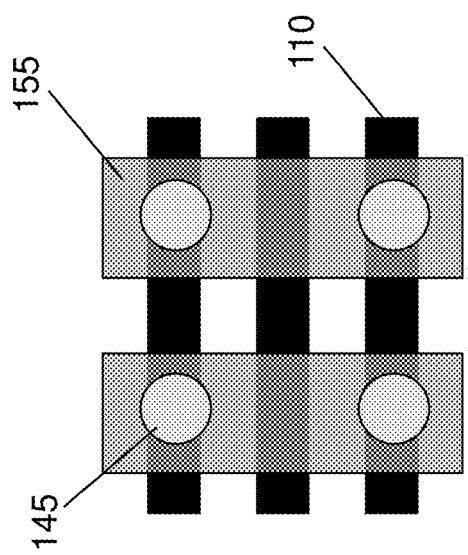

FIGS. 20A, 20B and 20C show various views of a sequential manufacturing operation of a semiconductor device according to an embodiment of the present disclosure. FIG. 20A is a plan view similar to FIG. 7A and includes the second wiring patterns 155. In some embodiments, the width (in the Y direction) of the first wiring pattern 110 is smaller than the width (in the X direction) of the second wiring pattern 155, and is in a range from about 8 nm to about 20 nm. In some embodiments, the width of the second wiring pattern 155 is in a range from about 25 nm to about 40 nm. In some embodiments, the space between adjacent first wiring patterns is in a range from about 10 nm to about 20 nm and the space between adjacent second wiring patterns is in a range from about 10 nm to about 45 nm. In some embodiments, the diameter of the opening 145 formed in the photo resist pattern 146 (see, FIGS. 7A-7C) or formed in the first oxide layer 136 (see, FIGS. 12A-12C) is larger than the width of the first wiring pattern 110 by about 0.5 nm to about 2 nm, and is in a range from about 9 nm to about 25 nm. In some embodiments, the diameter of the opening 145 is smaller than the width of the second wiring pattern 155 by about 1 nm to about 22 nm, and is in a range from about 9 nm to about 25 nm. In some embodiments, the shape of the opening 145 before the directional operation is substantially circular (about 0.90<[minimum diameter]/[maximum diameter]≤1). In some embodiments, the diameter or width along the Y direction of the opening 145 is smaller than the diameter or width along the X direction.

After the directional operation, the shape of the opening 145 is ellipsoidal as shown in FIG. 20B. In some embodiments, the shape of the opening 145 is rectangular with rounded corners as shown in FIG. 20C. In some embodiments, the maximum diameter or width along the X direction is in a range from about 10 nm to about 40 nm and the minimum diameter or width along the Y direction is in a range from about 5 nm to about 20 nm. In some embodiments, one or more parameters of the directional operation are adjusted such that the diameter or width along the Y direction is equal to or smaller than the width of the first wiring pattern 110. In some embodiments, one or more parameters of the directional operation are adjusted such that the diameter or width along the X direction is equal to or smaller than the width of the second wiring pattern 150. In some embodiments, the shape of the opening 145 after the directional operation satisfy 0.3≤[width along the Y direction]/[width along the X direction]≤0.6).

FIGS. 21A, 21B, 22A and 22B show various views of a sequential manufacturing operation of a semiconductor device according to an embodiment of the present disclosure. In some embodiments, after the first oxide layer 136, the first middle layer 134 and a part of the first intermediate layer 132 are etched, the opening width at the middle layer 134 is greater than the opening width at the first oxide layer 136 as shown in FIG. 21A or smaller than the opening width at the first oxide layer 136 as shown in FIG. 22A. Accordingly, in the directional operation, the redeposited layer 138 is formed along the uneven inner sidewall of the opening as shown in FIGS. 21B and 22B.

As set forth above, by using a directional operation including an etching phase along the X direction and a deposition phase along the Y direction at the same time, it is possible to improve a process margin and also possible to compensate an overlay error caused by the lithography operation, and thus obtain a higher yield in device manufacturing.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a target layer to be patterned is formed over a substrate, a mask layer having an opening is formed over the target layer, the opening is enlarged in a first direction without enlarging the opening in a second direction crossing the first direction by a directional process, where the first and second directions are parallel to an upper surface of the substrate, and the target layer is patterned to form a hole pattern corresponding to the opening. In one or more of the foregoing and following embodiments, the opening is shrunk in the second direction during the direction process. In one or more of the foregoing and following embodiments, the enlarging amount of the opening in the first direction is greater than a shrinkage amount of the opening in the second direction. In one or more of the foregoing and following embodiments, the enlarging amount of the opening in the first direction is twice time or more the shrinkage amount of the opening along the second direction. In one or more of the foregoing and following embodiments, the mask layer is made of oxide. In one or more of the foregoing and following embodiments, the oxide is silicon oxide and the target layer is made of a material different from the silicon oxide. In one or more of the foregoing and following embodiments, the directional process comprises applying Ar ions towards an upper surface of the mask layer with an angle θ, which is an angle between an ion beam direction and the upper surface, and the angle θ is more than zero degrees and equal to or less than 30 degrees. In one or more of the foregoing and following embodiments, the directional process comprises applying radicals generated by plasma towards an upper surface of the mask layer with an angle θ, which is an angle between an radial beam direction and the upper surface, and the angle θ is more than zero degrees and equal to or less than 30 degrees.

In accordance with another aspect of the present disclosure, in a method of manufacturing a semiconductor device, a lower conductive wire extending in a first direction is formed over a substrate, an interlayer dielectric (ILD) layer is formed over the lower conductive wire, a mask layer including an opening is formed over the ILD layer, the opening is enlarged in the first direction and shrunk in a second direction crossing the first direction by a directional process, where the first and second directions are parallel to an upper surface of the substrate, the ILD layer is patterned to form a via hole corresponding to the opening, and a via contact is formed by filling a conductive material into the via hole. In one or more of the foregoing and following embodiments, the mask pattern includes an upper oxide layer as an uppermost layer. In one or more of the foregoing and following embodiments, the mask pattern further includes a first middle layer and a bottom oxide layer, and a bottom of the opening is located at a middle of the bottom oxide layer. In one or more of the foregoing and following embodiments, a bottom layer is formed between the ILD layer and the bottom oxide layer. In the patterning the ILD layer, a remaining part of the bottom oxide layer is patterned to expose the bottom layer. The upper oxide layer is removed during the patterning the remaining part of the bottom oxide layer. The bottom layer is patterned by using the middle layer and the bottom oxide layer as an etching mask, and the ILD layer is patterned by using the bottom layer as an etching mask. In one or more of the foregoing and following embodiments, the upper oxide layer includes one of silicon oxide, silicon oxide containing nitrogen, aluminum oxide or hafnium oxide. In one or more of the foregoing and following embodiments, the directional process comprises applying ions of Ar, N or Si towards an upper surface of the mask layer with an angle θ, which is an angle between an ion beam direction and the upper surface, and the angle θ is more than zero degrees and equal to or less than 30 degrees. In one or more of the foregoing and following embodiments, the directional process comprises applying radicals generated by plasma towards an upper surface of the mask layer with an angle θ, which is an angle between an radial beam direction and the upper surface, and the angle θ is more than zero degrees and equal to or less than 30 degrees.

In accordance with another aspect of the present disclosure, in a method of manufacturing a semiconductor device, a lower conductive wire extending in a first direction is formed over a substrate, an interlayer dielectric (ILD) layer is formed over the lower conductive wire, a first bottom layer is formed over the ILD layer, a mask layer including a first mask layer is formed over the first bottom layer, a second mask layer is formed over the first mask layer and a third mask layer is formed over the second mask layer, a second bottom layer is formed over the mask layer, a middle layer is formed over the second bottom layer, a photo resist pattern having an opening is formed over the middle layer, the middle layer is etched by using the photo resist pattern as an etching mask, the second bottom layer is etched by using at least one of the middle layer or the photo resist matter as an etching mask, an opening corresponding to the opening is formed by etching the third mask layer and the second mask layer by using the second bottom layer as an etching mask, the second bottom layer is removed, the opening is enlarged in the first direction without enlarging the opening in a second direction crossing the first direction by a directional process, where the first and second directions are parallel to an upper surface of the substrate, the first mask layer is etched, the first bottom layer is etched, the ILD layer is patterned to form a via hole corresponding to the opening, and a via contact is formed by filling a conductive material into the via hole. In one or more of the foregoing and following embodiments, the third mask layer includes silicon oxide. In one or more of the foregoing and following embodiments, the opening is shrunk in the second direction during the direction process. In one or more of the foregoing and following embodiments, the second mask layer includes SiC. In one or more of the foregoing and following embodiments, the first mask layer includes silicon oxide.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a target layer to be patterned over a substrate;
    forming a mask layer having an opening over the target layer;
    enlarging the opening in a first direction without enlarging the opening in a second direction crossing the first direction by a directional process, the first and second directions being parallel to an upper surface of the substrate; and
    patterning the target layer to form a hole pattern corresponding to the opening.

2. The method of claim 1, wherein the opening is shrunk in the second direction during the directional process.

3. The method of claim 2, wherein an enlarging amount of the opening in the first direction is greater than a shrinkage amount of the opening in the second direction.

4. The method of claim 2, wherein an enlarging amount of the opening in the first direction is twice time or more a shrinkage amount of the opening along the second direction.

5. The method of claim 1, wherein the mask layer is made of an oxide.

6. The method of claim 5, wherein the oxide is silicon oxide and the target layer is made of a material different from the silicon oxide.

7. The method of claim 1, wherein:
    the directional process comprises applying Ar ions towards an upper surface of the mask layer at an angle θ, which is an angle between an ion beam direction and the upper surface, and
    the angle θ is more than zero degrees and equal to or less than 45 degrees.

8. The method of claim 1, wherein:
    the directional process comprises applying radicals generated by a plasma towards an upper surface of the mask layer at an angle θ, which is an angle between a radial beam direction and the upper surface, and
    the angle θ is more than zero degrees and equal to or less than 45 degrees.

9. A method of manufacturing a semiconductor device, comprising:
    forming a lower conductive wire extending in a first direction over a substrate;
    forming an interlayer dielectric (ILD) layer over the lower conductive wire;
    forming a mask layer including an opening over the ILD layer;
    enlarging the opening in the first direction and shrinking the opening in a second direction crossing the first direction by a directional process, the first and second directions being parallel to an upper surface of the substrate;
    patterning the ILD layer to form a via hole corresponding to the opening; and
    forming a via contact by filling a conductive material into the via hole.

10. The method of claim 9, wherein the mask pattern includes an upper oxide layer as an uppermost layer.

11. The method of claim 10, wherein:
    the mask pattern further includes a first middle layer and a bottom oxide layer, and
    a bottom of the opening is located at a middle of the bottom oxide layer.

12. The method of claim 10, wherein:
    a bottom layer is formed between the ILD layer and the bottom oxide layer, and
    the patterning the ILD layer comprises:
        patterning a remaining part of the bottom oxide layer to expose the bottom layer, wherein the upper oxide layer is removed during the patterning the remaining part of the bottom oxide layer;
        patterning the bottom layer by using the middle layer and the bottom oxide layer as an etching mask; and
        patterning the ILD layer by using the bottom layer as an etching mask.

13. The method of claim 10, wherein the upper oxide layer includes one of a silicon oxide, a silicon oxide containing nitrogen, an aluminum oxide or a hafnium oxide.

14. The method of claim 9, wherein:
    the directional process comprises applying ions of Ar, N or Si towards an upper surface of the mask layer at an angle θ, which is an angle between an ion beam direction and the upper surface, and
    the angle θ is more than zero degrees and equal to or less than 45 degrees.

15. The method of claim 9, wherein:
    the directional process comprises applying radicals generated by a plasma towards an upper surface of the mask layer at an angle θ, which is an angle between a radial beam direction and the upper surface, and
    the angle θ is more than zero degrees and equal to or less than 45 degrees.

16. A method of manufacturing a semiconductor device, comprising:
    forming a lower conductive wire extending in a first direction over a substrate;
    forming an interlayer dielectric (ILD) layer over the lower conductive wire;
    forming a first bottom layer over the ILD layer;

forming a mask layer including a first mask layer over the first bottom layer, a second mask layer over the first mask layer and a third mask layer over the second mask layer;

forming a second bottom layer over the mask layer;

forming a middle layer over the second bottom layer;

forming a photo resist pattern having an opening over the middle layer;

etching the middle layer by using the photo resist pattern as an etching mask;

etching the second bottom layer by using at least one of the middle layer or the photo resist pattern as an etching mask;

forming an opening corresponding to the opening by etching the third mask layer and the second mask layer by using the second bottom layer as an etching mask;

removing the second bottom layer;

enlarging the opening in the first direction without enlarging the opening in a second direction crossing the first direction by a directional process, the first and second directions being parallel to an upper surface of the substrate;

etching the first mask layer;

etching the first bottom layer;

patterning the ILD layer to form a via hole corresponding to the opening; and forming a via contact by filling a conductive material into the via hole.

17. The method of claim 16, wherein the third mask layer includes a silicon oxide.

18. The method of claim 17, wherein the opening is shrunk in the second direction during the directional process.

19. The method of claim 18, wherein the second mask layer includes SiC.

20. The method of claim 19, wherein the first mask layer includes a silicon oxide.

* * * * *